United States Patent
Mahajani et al.

(10) Patent No.: US 6,858,899 B2
(45) Date of Patent: Feb. 22, 2005

(54) THIN FILM TRANSISTOR WITH METAL OXIDE LAYER AND METHOD OF MAKING SAME

(75) Inventors: Maitreyee Mahajani, Saratoga, CA (US); Andrew J. Walker, Mountain View, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 0 days.

(21) Appl. No.: 10/270,127

(22) Filed: Oct. 15, 2002

(65) Prior Publication Data

US 2004/0069990 A1 Apr. 15, 2004

(51) Int. Cl.$^7$ .............................................. H01L 27/01
(52) U.S. Cl. ........................ 257/347; 257/321; 257/410
(58) Field of Search ................................ 257/347, 321, 257/324, 410

(56) References Cited

U.S. PATENT DOCUMENTS

| | | | |
|---|---|---|---|
| 5,306,935 A | 4/1994 | Esquivel et al. | |
| 5,691,552 A | * 11/1997 | Oyama | ........................ 257/316 |
| 5,889,302 A | * 3/1999 | Liu | ............................. 257/315 |
| 6,185,122 B1 | 2/2001 | Johnson et al. | |
| 6,191,459 B1 | 2/2001 | Hoffmann et al. | |
| 6,248,635 B1 | 6/2001 | Foote et al. | |
| 6,285,586 B1 | 9/2001 | Lung et al. | |
| 6,285,596 B1 | 9/2001 | Miura et al. | |
| 6,288,419 B1 | 9/2001 | Prall et al. | |
| 6,297,143 B1 | 10/2001 | Foote et al. | |
| 6,301,155 B1 | 10/2001 | Fujiwara | |
| 6,313,503 B1 | 11/2001 | Lee et al. | |
| 6,319,775 B1 | 11/2001 | Halliyal et al. | |
| 6,326,268 B1 | 12/2001 | Park et al. | |
| 6,348,380 B1 | 2/2002 | Weimer et al. | |
| 6,593,624 B2 | * 7/2003 | Walker | ........................ 257/344 |
| 6,617,639 B1 | * 9/2003 | Wang et al. | ................. 257/324 |
| 6,630,383 B1 | * 10/2003 | Ibok et al. | ................... 438/264 |
| 6,660,588 B1 | * 12/2003 | Yang et al. | ................. 438/257 |
| 2001/0030340 A1 | 10/2001 | Fujiwara | |
| 2001/0041250 A1 | 11/2001 | Werkhoven et al. | |
| 2001/0041434 A1 | 11/2001 | Nakamura | |
| 2001/0046738 A1 | 11/2001 | Au et al. | |
| 2001/0052615 A1 | 12/2001 | Fujiwara | |
| 2001/0055838 A1 | 12/2001 | Walker et al. | |
| 2002/0000592 A1 | 1/2002 | Fujiwara | |
| 2002/0020890 A1 | 2/2002 | Willer | |
| 2002/0024092 A1 | 2/2002 | Palm et al. | |
| 2002/0028541 A1 | 3/2002 | Lee et al. | |
| 2002/0033501 A1 | 3/2002 | Sakagami | |

OTHER PUBLICATIONS

U.S. Provisional application No. 60/412,739.*
Non–Volatile Semiconductor Workshop, Feb. 16–20, 2003, Monterey, California, NVSMW Conference Schedule/Program.

(List continued on next page.)

*Primary Examiner*—Mark V. Prenty
(74) *Attorney, Agent, or Firm*—Foley & Lardner LLP

(57) ABSTRACT

A thin film transistor includes an insulating substrate, an active layer located over the substrate, a gate electrode located over the substrate; and a charge storage region located between the active layer and the gate electrode. The charge storage region includes a tunneling dielectric located adjacent to the active layer, a blocking dielectric located adjacent to the gate electrode and a charge storage dielectric located between the tunneling dielectric and the blocking dielectric. At least one of the tunneling dielectric, the charge storage dielectric and the blocking dielectric comprises a layer having a dielectric constant greater than 3.9, such as a metal oxide layer.

46 Claims, 3 Drawing Sheets

OTHER PUBLICATIONS

Improved SONOS–type Flash Memory using $HfO_2$ as Trapping Layer, Min She, et al, Non–Volatile Semiconductor Workshop, Feb. 16–20, 2003, Monterey, California, p. 53.

High Reliable SONOS–type NAND Flash Memory Cell with $Al_2O_3$ for Top Oxide, Yoocheol Shin, et al, Non–Volatile Semiconductor Workshop, Feb. 16–20, 2003, Monterey, California, p. 58.

New 2–bit/Tr MONOS Type Flash Memory using $Al_2O_3$ as Charge Trapping Layer, Taro Sugizaki, et al, Non–Volatile Semiconductor Workshop, Feb. 16–20, 2003, Monterey, California, p. 60.

Flash Memory Cell with $LaAlO_3$ (k=27.5) as Tunneling Dielectrics for beyond Sub–50 nm Technology, Yaohui Zhang, et al., Non–Volatile Semiconductor Workshop, Feb. 16–20, 2003, Monterey, California, p. 75.

A novel low voltage memory device with an engineered $SiO_2$/high–k tunneling barrier, P. Bloome et al., Non–Volatile Semiconductor Workshop, Feb. 16–20, 2003, Monterey, California, p. 94.

Characterization of the Aluminum–Tantalum Oxide–Silicon Dioxide–Silicon Charge Storage (MTOS) Device, R.L. Angle, G.E. Talley, IEDM 1988 Proc. p. 466–468.

CMOS Metal Replacement Gate Transistors Using Tantalum Pentoxide Gate Insulator, A. Chatterjee, et al, IEDM 1998 Proc. p. 29.1.1–29.1.4.

Deposited Inter–Polysilicon Dielectrics for Nonvolatile Memories, Johan H. Klootwijk, Member, IEEE, et al., IEEE Transactions on Electron Devices, vol. 46, No. 7, Jul. 1999, p. 1435–1445.

* cited by examiner

THIN FILM TRANSISTOR WITH METAL OXIDE LAYER AND METHOD OF MAKING SAME

FIELD OF THE INVENTION

The present invention is directed generally to semiconductor devices and methods of fabrication and more particularly to a charge storage thin film transistor array and method of fabrication.

BACKGROUND OF THE INVENTION

U.S. application Ser. No. 20020028541 which was filed as U.S. application Ser. No. 09/927,648, on Aug. 13, 2001 and which is incorporated by reference in its entirety, discloses a monolithic three dimensional array of charge storage devices. In one embodiment in this application, the charge storage devices of the array comprise both top gate staggered and inverted (i.e., bottom gate) staggered thin film transistors. Thin film transistors are called "staggered" when the gate electrode is located on the opposite side of the active layer from the source and drain electrodes.

The charge storage thin film transistors in the array store charge in charge storage regions, such as in dielectric isolated floating gates or in a so called "ONO" (oxide-nitride-oxide) film or stack. The floating gate is separated from the channel region by a silicon oxide tunneling layer and is separated from the control gate by a silicon oxide blocking layer. Likewise, the silicon nitride change storage layer in an ONO film or stack is located between a silicon oxide tunneling layer and a silicon oxide blocking layer.

In a top gate transistor, where the gate electrode is located above the channel region, a high quality tunneling silicon oxide layer is formed by thermally growing the silicon oxide layer on the channel region. This thermal oxide is formed by exposing a silicon channel region to a dry or wet oxygen containing atmosphere, and-converting a top portion of the silicon channel region to a silicon oxide layer. However, in a bottom gate thin film transistor, this thermal silicon dioxide cannot be grown on the channel region because the tunneling layer is located below the channel region. Thus, the silicon dioxide tunneling layer has to be deposited on the nitride charge storage layer of the ONO charge storage region using a silicon oxide deposition method, such as chemical vapor deposition (CVD), physical vapor deposition (PVD), such as sputtering, or atomic layer deposition (ALD) methods.

BRIEF SUMMARY OF THE INVENTION

A preferred embodiment of the present invention provides a thin film transistor, comprising an insulating substrate, an active layer located over the substrate, a gate electrode located over the substrate, and a charge storage region located between the active layer and the gate electrode. The charge storage region comprises a tunneling dielectric located adjacent to the active layer, a blocking dielectric located adjacent to the gate electrode and a charge storage dielectric located between the tunneling dielectric and the blocking dielectric. At least one of the tunneling dielectric, the charge storage dielectric and the blocking dielectric comprises a layer having a dielectric constant greater than 3.9.

Another preferred embodiment of the present invention provides an inverted thin film transistor, comprising an insulating substrate, a gate electrode located over the insulating substrate, an active layer located over the gate electrode, and a charge storage region located between the active layer and the gate electrode. The charge storage region comprises a tunneling dielectric located adjacent to the active layer, a blocking dielectric located adjacent to the gate electrode and a charge storage dielectric located between the tunneling dielectric and the blocking dielectric. At least one of the tunneling dielectric, the charge storage dielectric and the blocking dielectric comprises a layer having a dielectric constant greater than 3.9.

Another preferred embodiment of the present invention provides a monolithic three dimensional array, comprising a substrate and a plurality of device levels comprising a plurality of thin film transistors with charge storage regions, wherein at least one of a tunneling dielectric, a charge storage dielectric and a blocking dielectric in the charge storage regions comprises a metal oxide layer.

Another preferred embodiment of the present invention provides a thin film transistor, comprising an insulating substrate, an active layer located over the substrate, a control gate electrode located over the substrate, and a charge storage region located between the active layer and the control gate electrode. The charge storage region comprises a metal oxide tunneling dielectric located adjacent to the active layer, a blocking dielectric located adjacent to the control gate electrode and a floating gate located between the tunneling dielectric and the blocking dielectric.

DETAILED DESCRIPTION OF THE PREFERRED EMBODIMENTS

The present inventors have realized that since a tunneling layer in an inverted thin film transistor has to be deposited on a charge storage layer rather than being thermally grown on a channel region, a high dielectric constant tunneling layer, such as a metal oxide tunneling layer, may be used instead of a silicon oxide tunneling layer. A metal oxide tunneling layer has a higher dielectric constant than a silicon oxide tunneling layer. A higher dielectric constant of the tunneling layer results in less charge leakage and increased device reliability. The present inventors also realized that it is advantageous to form a metal oxide blocking layer in a thin film transistor for the same reasons.

Furthermore, the present inventors have realized that the charge storage dielectric of a thin film transistor may also be made of a high dielectric constant material, such as a metal oxide layer. A metal oxide charge storage layer has a higher capacitance than a silicon nitride charge storage layer with about the same storage capacity. The higher capacitance of the tunneling layer/charge storage layer/blocking layer stack improves the sub threshold swing of the thin film transistors. The use of metal oxide layers with a higher dielectric constant than silicon oxide or silicon nitride also allows the thickness of the tunneling layer/charge storage layer/blocking layer stack to be increased compared to the conventional ONO stack without sacrificing device performance, thereby improving device reliability. By the same token, for low voltage applications, the thickness of the high dielectric constant metal oxide layers can be scaled further down without impacting device performance and reliability. Decreasing the thickness of the dielectric layers without impacting device performance is becoming extremely difficult and in some cases impossible for conventional ONO stacks, as discussed in IEEE Trans. on Electron Devices Vol. 43, No. 1, Jan. 1996 pages 47–53 and IEEE Trans. on Components, Packaging and Manufacturing, Tech. A, Vol. 17, No. 3, Sept. 1994, pages 390–397, incorporated herein by reference.

Figure 1:
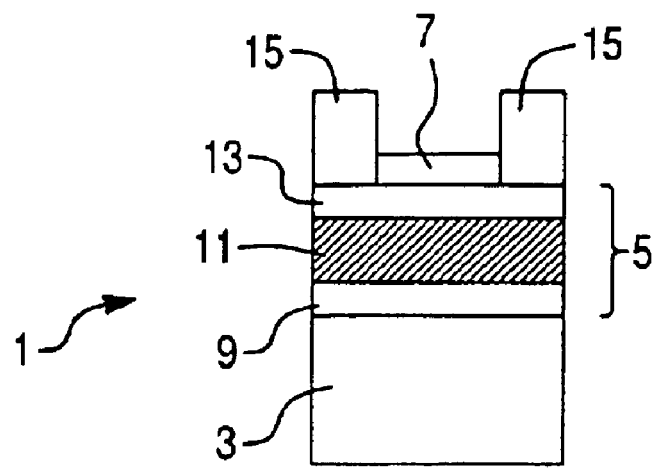
FIG. 1 is a side cross sectional view of an inverted staggered thin film transistor according to the first preferred embodiment of the present invention.

FIG. 1 illustrates an inverted staggered thin film transistor 1 with a charge storage region according to a first preferred embodiment of the present invention. The transistor 1 includes a gate electrode 3 which is located over an insulating substrate. Preferably, the gate electrode is located over an insulating layer formed over a substrate, such as a semiconductor substrate. However, the gate electrode 3 may be formed directly on or over a substrate made of an insulating material, such as plastic, glass or ceramic.

A charge storage region or stack 5 is located on the gate electrode 3. An active layer 7 is located on the charge storage region 5. Bit lines 15 are located in contact with the active layer 7.

In the preferred aspects of the first embodiment, the charge storage region 5 comprises a tunneling dielectric 13 located adjacent to the active layer 7, a blocking dielectric 9 located adjacent to the gate electrode 3 and a charge storage dielectric 11 located between the tunneling dielectric 13 and the blocking dielectric 9. At least one of the tunneling dielectric 13, the charge storage dielectric 11 and the blocking dielectric 9 comprises a layer having a dielectric constant higher than that of silicon oxide. In other words, this layer has a dielectric constant greater than 3.9. Preferably, this high dielectric constant layer is a metal oxide layer. Preferably, any two of the tunneling dielectric 13, the charge storage dielectric 11 and the blocking dielectric 9 comprise a metal oxide layer. Preferably, each of the tunneling dielectric 13, the charge storage dielectric 11 and the blocking dielectric 9 comprise a metal oxide layer.

In a first preferred aspect of the first embodiment, the tunneling dielectric 13 comprises a metal oxide layer. Any suitable metal oxide layer may be used. Preferred metal oxide layers comprise aluminum oxide, tantalum oxide, yttrium oxide, calcium oxide, magnesium oxide or zirconium oxide. This layer preferably comprises a stoichiometric metal oxide layer, such as $Al_2O_3$, $Ta_2O_5$, $Y_2O_3$, CaO, MgO or $ZrO_2$, but may also comprise a non-stoichiometric metal oxide layer, if desired. Most preferably, the tunneling dielectric comprises aluminum oxide or tantalum oxide.

The charge storage dielectric 11 may comprise any suitable layer. For example, the charge storage dielectric may comprise a silicon nitride or a metal oxide layer. A portion of nitrogen in the silicon nitride layer may optionally be substituted with oxygen to form a silicon oxynitride layer. Any suitable metal oxide layer may be used. Preferred metal oxide layers comprise tantalum oxide, zirconium oxide or hafnium oxide. This layer preferably comprises a stoichiometric metal oxide layer, such as $Ta_2O_5$, $ZrO_2$ or $HfO_2$ but may also comprise a non-stoichiometric metal oxide layer, if desired. If the charge storage dielectric 11 comprises a metal oxide layer, then it is preferred that this metal oxide layer is different from the metal oxide tunneling dielectric layer 13. For example, if the charge storage dielectric 11 comprises tantalum oxide or zirconium oxide, then the tunneling dielectric preferably comprises an aluminum oxide layer.

The blocking dielectric 9 may comprise any suitable layer. For example, the blocking dielectric layer may comprise a silicon dioxide layer, such as a high temperature silicon dioxide layer (HTO). Alternatively, the blocking dielectric 9 comprises a metal oxide layer, such as stoichiometric or non-stoichiometric aluminum oxide, tantalum oxide, yttrium oxide, calcium oxide, magnesium oxide or zirconium oxide. Thus, in addition to the metal oxide tunneling dielectric 13, one or both of the charge storage dielectric 11 and the blocking dielectric 9 may comprise metal oxide layers.

In a second preferred aspect of the first embodiment, the charge storage dielectric 11 comprises a metal oxide layer. As discussed above, the preferred metal oxide layer comprises stoichiometric or non-stoichiometric tantalum oxide, zirconium oxide or hafnium oxide. In the second preferred aspect of the first embodiment, one or both of the tunneling dielectric 13 and the blocking dielectric 9 comprise silicon dioxide layers, such as HTO layers. Alternatively, one or both of the tunneling dielectric 13 and the blocking dielectric 9 comprise a metal oxide layer that is different from the metal oxide layer of the charge storage dielectric.

In a third preferred aspect of the first embodiment, the blocking dielectric 9 comprises a metal oxide layer. As discussed above, the preferred metal oxide layer comprises stoichiometric or non-stoichiometric aluminum oxide, tantalum oxide, yttrium oxide, calcium oxide, magnesium oxide or zirconium oxide. Aluminum oxide is the most preferred metal oxide material. In a third preferred aspect of the first embodiment, the tunneling dielectric 13 and the charge storage dielectric 11 may comprise silicon dioxide and silicon nitride layers, respectively. Alternatively, one or both of the tunneling dielectric 13 and the charge storage dielectric 9 comprise a metal oxide layer.

One preferred combination of tunneling 13, charge storage 11 and blocking 9 dielectrics comprises aluminum oxide tunneling dielectric, silicon nitride charge storage dielectric and silicon dioxide blocking dielectric. Aluminum oxide is preferred because it has a band gap that is similar to silicon dioxide and which is compatible with a silicon nitride layer being used for charge storage or trapping. More generally, metal oxides with a band gap offset of greater than 0.5 eV for electrons and holes compared to silicon are preferred. Preferably, the silicon oxide blocking layer 9 is an HTO layer. Another preferred combination of tunneling 13, charge storage 11 and blocking 9 dielectrics comprises aluminum oxide tunneling and blocking dielectrics and tantalum oxide, zirconium oxide or hafnium oxide charge storage dielectric.

The dielectric layers 13, 11 and 9 may have any suitable thickness. For example, the tunneling dielectric layer 13 is preferably 1 to 20 nm thick, such as 2–7 nm thick. The charge storage dielectric layer 11 is preferably 3 to 30 nm thick, such as 4 to 15 nm thick. The blocking dielectric layer 9 is preferably 3 to 50 nm thick, such as 4 to 10 nm thick.

In a fourth preferred aspect of the first embodiment, the charge storage dielectric 11 is replaced with a floating gate. The floating gate preferably comprises a polysilicon layer and is used to store charge therein. In the fourth preferred aspect, the tunneling dielectric 13 located between the floating gate and the active layer 7 comprises a metal oxide layer. The blocking dielectric 9 located between the gate electrode 3 (which is referred to as a control gate when a floating gate is present) and the floating gate comprises an ONO stack, a silicon dioxide or a metal oxide layer.

It should be noted that while binary metal oxide compounds have been listed as the preferred charge storage region metal oxide layers, the present invention should not be considered to be limited to such compounds. Other high dielectric constant materials may also be used. For example, ternary metal oxide compounds, which include metal oxynitride compounds, such as aluminum oxynitride, and multiple metal oxide compounds, such as yttrium zirconium oxide or yttria stabilized zirconia may also be used. Furthermore, other high dielectric constant materials, such as metal nitride compounds may also be used.

Any suitable materials may be used for the gate electrode 3, the active layer 7 and the bit lines 15. Preferably, the gate electrode 3 comprises a polysilicon layer and a conductive layer, such as a metal silicide layer. The gate electrode 3 preferably comprises a portion of a word line which extends perpendicular to the bit lines 15. The active layer 7 preferably comprises a semiconductor layer, such as a polysilicon or amorphous silicon layer. Preferably, the portion of the active layer 7 between the bit lines 15 comprises an intrinsic or lightly doped channel region of the transistor 1. The bit lines 15 may comprise any suitable conductive materials, such as polysilicon layer and a conductive layer, such as a metal silicide layer. The lower portions of the bit lines 15 which contact the side surfaces of the active layer 7 may act as source and drain regions of the transistor 1. Alternatively, the source and drain regions of the transistor may comprise heavily doped regions in the active layer 7 and the bit lines 15 may contact the top surface of the active layer 7 rather than side surfaces of the active layer 7.

Figure 2:
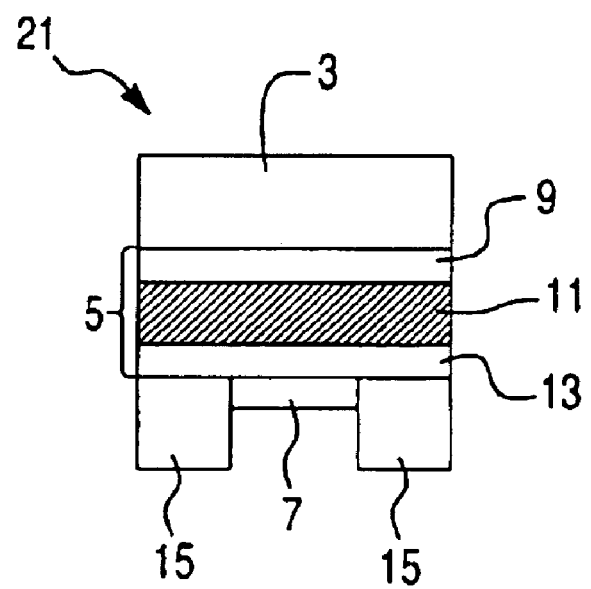
FIG. 2 is a side cross sectional view of a top gate staggered thin film transistor according to the second preferred embodiment of the present invention.

FIG. 2 illustrates a top gate staggered thin film transistor 21 with a charge storage region according to a second preferred embodiment of the present invention. The top gate staggered thin film transistor 21 is the same as the inverted or bottom gate staggered thin film transistor 1 shown in FIG. 1, except that the order of layers in transistor 21 is reversed compared to transistor 1.

In the top gate transistor 21, the bit lines 15 and the active layer 7 are located above a substrate. The tunneling dielectric 13 is located above the active layer 7. The charge storage dielectric or floating gate 11 is located above the tunneling dielectric 13. The blocking dielectric 9 is located above the charge storage dielectric or floating gate 11. The gate electrode 3 is located above the blocking dielectric 9.

The transistors 1 and 21 may be made by any, suitable method. Each layer of the transistors 1 and 21 may be deposited over the substrate by any suitable method, such as chemical vapor deposition (CVD), atomic layer deposition (ALD) or physical vapor deposition (PVD), such as sputtering, methods. Insulating layers may also be thermally grown on silicon where a silicon surface is available. The layers may be patterned by any suitable technique, such as photolithographic masking and etching. Source and drain regions may be formed by ion implantation of dopants of a first conductivity type into the active layer of a second conductivity type or by outdiffusing dopants of a first conductivity type from polysilicon bit lines into the active layer of a second conductivity type.

Figure 3:
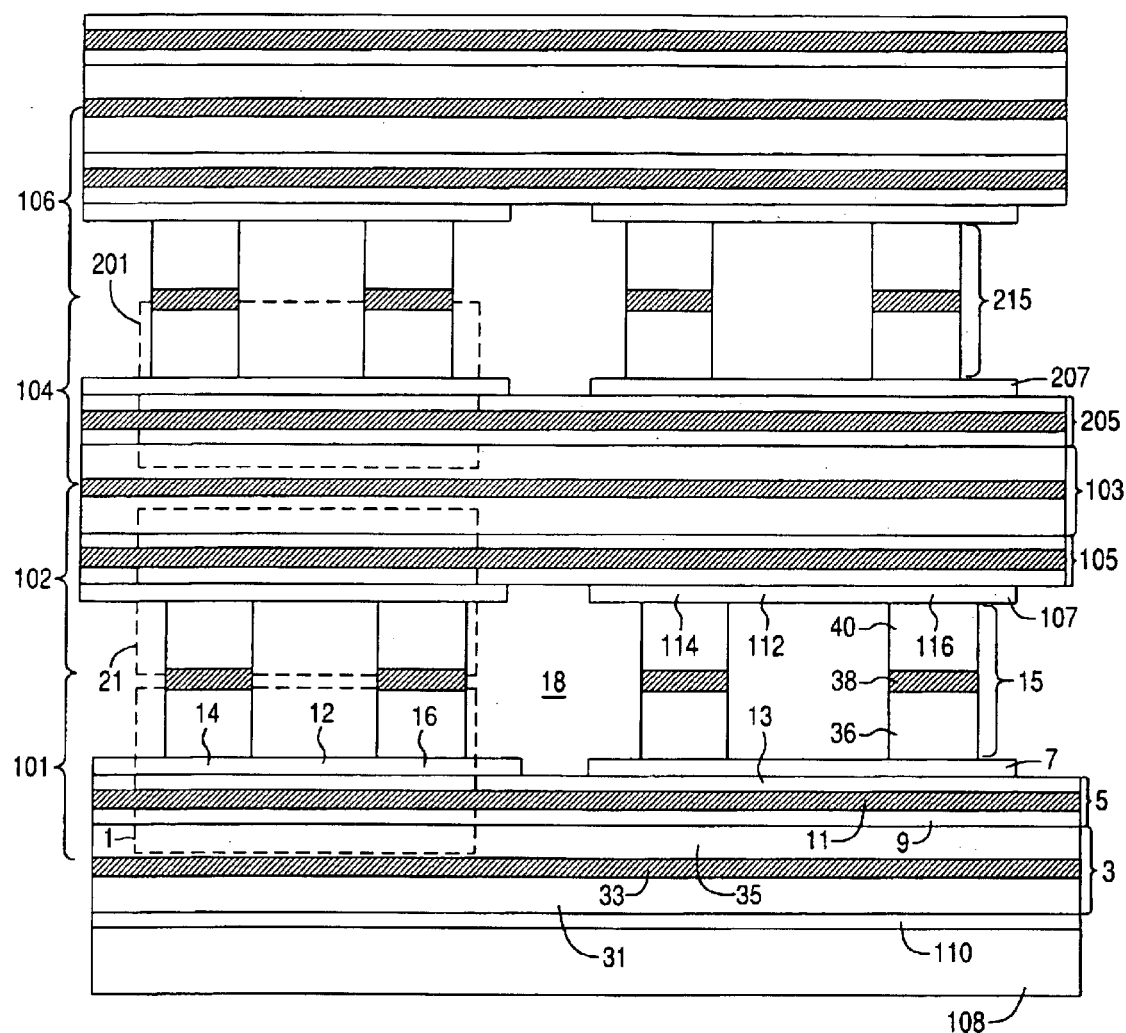
FIG. 3 is a side cross sectional view of a three dimensional array of thin film transistors according to the third preferred embodiment of the present invention.

In a third preferred embodiment of the present invention, the thin film transistors 1 and/or 21 of the first and/or second preferred embodiments are incorporated into a monolithic, three dimensional array of thin film transistors 100, as shown in FIG. 3. The array 100 may have any desired configuration.

In a preferred configuration shown in FIG. 3, a first device level 101 comprises a plurality of first inverted staggered thin film transistors 1 which contain charge storage regions including at least one metal oxide layer. A second device 102 level is preferably monolithically formed over the first device level 101. The second device level 102 comprises a plurality of second top gate thin film transistors 21 which contain charge storage regions including at least one metal oxide layer. A device level is monolithically formed over a lower device level when it is deposited on the lower device level layer by layer, instead of the entire upper device layer being formed separately and then glued or bonded to the lower device layer.

A suitable number of additional device levels having a similar configuration to the device levels 101 and 102 may be monolithically formed over the second device level. For example, additional device levels 104 and 106 are formed over the second device level 102 as shown in FIG. 3.

The array 100 contains a plurality of first word lines 3 extending in a first direction. The first word lines 3 are located at a first height above the substrate 108. One or more other layers, such as insulating layer(s) 110 may be located between word lines 3 and substrate 108. The first word lines 3 preferably comprise a metal silicide layer 33 located between two polysilicon layers 31, 35. However, any other suitable conductive layer or layers may be used instead. A first planarized insulating fill layer (not shown in FIG. 3) is located between adjacent word lines.

A first charge storage region 5 is located on the first word lines 3. The charge storage region 5 preferably comprises a tunneling layer 13/charge storage layer 11/blocking layer 9 dielectric stack as described above. Alternatively, if desired, the charge storage region 5 may comprise a dielectric isolated floating gate, in which case the floating gate will be laterally isolated between devices in the direction of the word lines. The first active layer is 7 is located on the first charge storage region 5. Preferably, the first active layer 7 is patterned into active layer islands, as shown in FIG. 3. First bit lines 15 are located on source 14 and drain 16 regions in the first active layer 7. The first bit lines 15 extend in a second direction different from the first direction. The bit lines 15 preferably comprise a metal silicide layer 38 located between two polysilicon layers 36, 40. However, any other suitable conductive layer or layers may be used instead.

A second planarized insulating fill layer 18 is located between the first bit lines 15. A second active layer 107 is located on the first bit lines 15 and fill layer 18. A second charge storage region 105 is located on the second active layer 107. Second word lines 103 (only one is shown in the view of FIG. 3) are located on the second charge storage region 105. The second word lines 103 extend in the same direction as the first word lines 3 and also preferably comprise a metal silicide layer between two polysilicon layers, as the first word lines.

The array 100 contains a plurality of bottom gate staggered thin film transistors 1 and a plurality of top gate staggered thin film transistors 21. The channel 12, source 14 and drain 16 regions of each first transistor 1 are located in a portion of the first active layer 7. Preferably, a channel 12, source 14 and drain 16 regions comprise active layer islands. A gate electrode of each first transistor 1 is located in a portion of one of the first word lines 3. The charge storage region 5 contains at least one high dielectric constant layer, such as a metal oxide layer.

The channel 112, source 114 and drain 116 regions of each second transistor 21 are located in a portion of the second active layer 107. The gate electrode of each second transistor 21 is located in a portion of one of the second word lines 103. The charge storage region 105 contains at least one high dielectric constant layer, such as a metal oxide layer.

Thus, as shown in FIG. 3, the first 1 and the second 21 transistors share the first bit lines 15. The first device level 101 contains the first word lines 3 and the first bit lines 15. The second device level 102 contains the second word lines 103 and the first bit lines 15.

If desired, the array 100 contains additional device levels. For example, a third charge storage region 205 is located on the second word lines 103. A third active layer 207 is located on the third charge storage region 205. Second bit lines 215 are located on the third active layer 207. The second bit lines 215 extend in the same direction as the first bit lines 15. The second bit lines 215 also preferably comprise a metal silicide layer between two polysilicon layers, as the first bit lines. Thus, third inverted staggered thin film transistors 201 are located above the second top gate transistors 21.

As shown in FIG. 3, the second 21 and the third 201 transistors share the second word lines 103. The channel, source and drain regions of each third transistor 201 are located in a portion of the third active layer 207. The charge storage region 205 contains at least one high dielectric constant layer, such as a metal oxide layer. A gate electrode of each third transistor 201 is located in a portion of one of the second word lines 103. The second bit lines 215 comprise the bit lines of each third transistor 201.

If desired, additional device levels, such as level 106, may be formed in the array 100 as shown in FIG. 3. These device levels alternate the inverse staggered thin film transistors and top gate thin film transistors in the manner described above. The array 100 may have any desired number of levels, such as two to eight levels. The transistors 1, 21, 201 of the array 100 described with respect to FIG. 3 are charge storage transistors that are preferably used in an erasable programmable read only memory (EPROM) or an electrically erasable programmable read only memory (EEPROM).

The present invention is not limited to the array 100 configuration shown in FIG. 3. Other array configurations, such as those described in U.S. application Ser. No. 20020028541, incorporated herein by reference, may be used instead. For example, the array may contain only inverse staggered or top gate staggered thin film transistors separated by an interlevel dielectric layer.

The following specific examples should not be considered to be limiting on the scope of the invention. In a first specific example, the top gate thin film transistor 21 illustrated in FIG. 2 was fabricated with the tunneling layer 13/charge storage layer 11/blocking layer 9 dielectric stack charge storage region 5. The tunneling layer 13 comprised a 25 Angstrom $Al_2O_3$ layer. The charge storage layer 11 comprised a 140 Angstrom $HfO_2$ layer. The blocking layer 9 comprised a 50 Angstrom $Al_2O_3$ layer.

Figure 4:
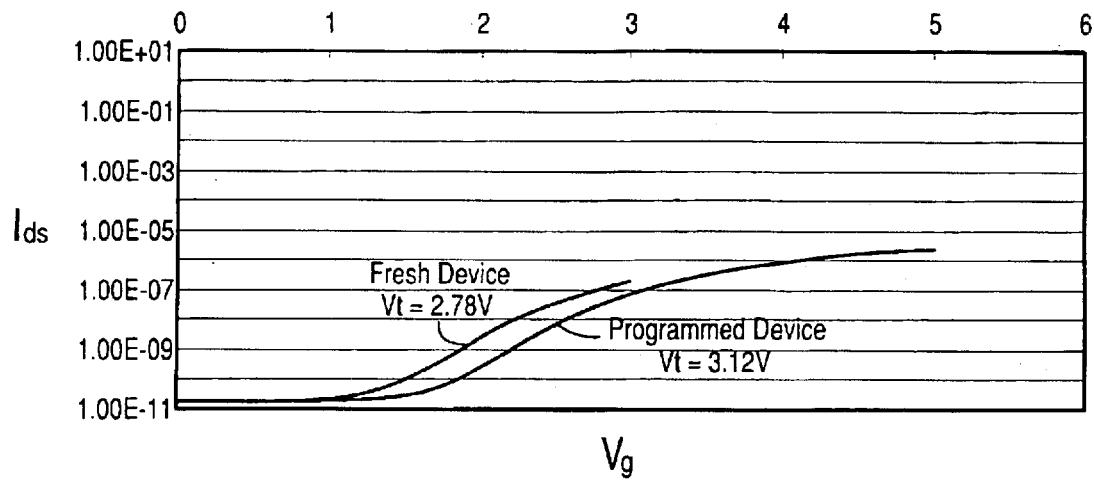
FIGS. 4 and 5 are current—voltage graphs of transistors made according to the specific examples of the present invention.

FIG. 4 illustrates the I–V characteristics for fresh and programmed devices. As can be seen from FIG. 4, after a programming pulse of 9V for 30 µs, the threshold voltage ($V_t$) of the device is shifted from 2.78 V to 3.12 V. The threshold voltage and can be further shifted to 3.69 V by adjusting programming conditions.

This experiment confirms that charge is capable of tunneling through a 25 Angstrom $Al_2O_3$ layer. This layer can be used as a tunneling dielectric oxide in a tunneling layer/ charge storage layer/blocking layer dielectric stack type device (i.e., in a SONOS type device) or a floating gate type device. This experiment also confirms that a $HfO_2$ layer is capable of retaining charge and hence can be used as a charge storage layer in a SONOS device or as part of the blocking dielectric stack in case of a floating gate device.

In a second specific example, the top gate thin film transistor 21 illustrated in FIG. 2 was fabricated with the tunneling layer 13/charge storage layer 11/blocking layer 9 dielectric stack charge storage region 5. The tunneling layer 13 comprised a 25 Angstrom $SiO_2$ layer. The charge storage layer 11 comprised a 50 Angstrom silicon nitride layer. The blocking layer 9 comprised a 100 Angstrom $Al_2O_3$ layer.

Figure 5:
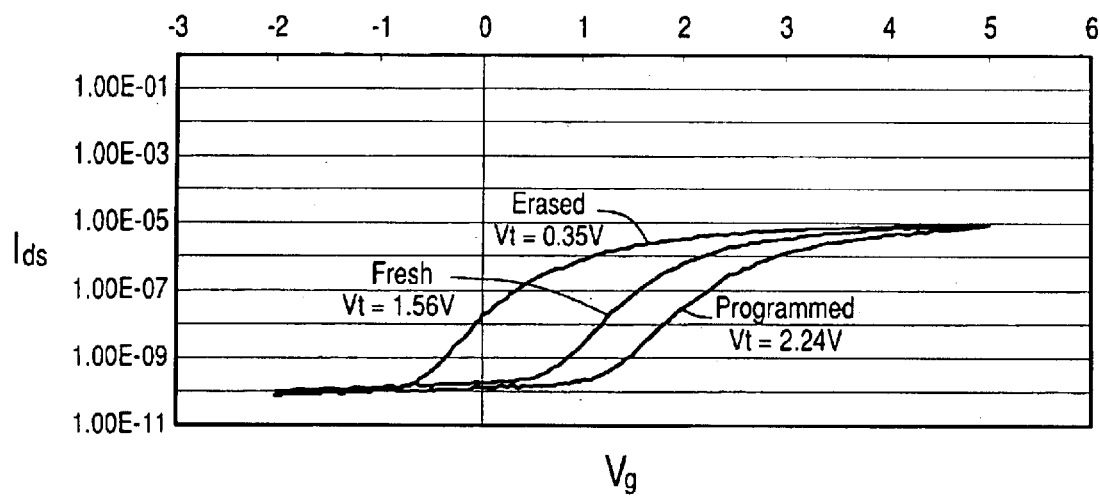

FIG. 5 illustrates the I–V characteristics for fresh, erased and programmed devices. As can be seen from FIG. 5, $V_t$ was 0.35 V for the erased device, 1.56 V for the fresh device and 2.24 V for the programmed device. Thus, a shift of greater than 2 V was obtained between the erased and programmed state of the device when programmed with a pulse of 11 V for 30 microseconds and erased with a pulse of –8 V for +100 ms. This experiment confirms that $Al_2O_3$ can be used as a blocking dielectric in conjunction with conventional oxide and nitride layers or in conjunction with other high dielectric constant materials, as shown in the first example.

The foregoing description of the invention has been presented for purposes of illustration and description. It is not intended to be exhaustive or to limit the invention to the precise form disclosed, and modifications and variations are possible in light of the above teachings or may be acquired from practice of the invention. The drawings and description were chosen in order to explain the principles of the invention and its practical application. The drawings are not necessarily to scale and illustrate the array in schematic block format. It is intended that the scope of the invention be defined by the claims appended hereto, and their equivalents.

What is claimed is:

1. A thin film transistor, comprising:
   an insulating substrate;
   an active layer located over the substrate;
   a gate electrode located over the substrate; and
   a charge storage region located between the active layer and the gate electrode, wherein:
     the charge storage region comprises a tunneling dielectric located adjacent to the active layer, a blocking dielectric located adjacent to the gate electrode and a charge storage dielectric located between the tunneling dielectric and the blocking dielectric; and
     at least one of the tunneling dielectric and the blocking dielectric comprises a layer having a dielectric constant greater than 3.9.

2. A thin film transistor, comprising:
   an insulating substrate;
   an active layer located over the substrate;
   a gate electrode located over the substrate; and
   a charge storage region located between the active layer and the gate electrode, wherein:
     the charge storage region comprises a tunneling dielectric located adjacent to the active layer, a blocking dielectric located adjacent to the gate electrode and a charge storage dielectric located between the tunneling dielectric and the blocking dielectric; and
     at least one of the tunneling dielectric, the charge storage dielectric and the blocking dielectric comprises a layer having a dielectric constant greater than 3.9; and the layer having a dielectric constant greater than 3.9 comprises a metal oxide layer.

3. The transistor of claim 2, wherein the active layer is located above the gate electrode.

4. The transistor of claim 2, wherein the active layer is located below the gate electrode.

5. The transistor of claim 2, wherein the tunneling dielectric comprises a metal oxide layer.

6. The transistor of claim 5, wherein the tunneling dielectric comprises aluminum oxide, tantalum oxide, yttrium oxide, calcium oxide, magnesium oxide or zirconium oxide.

7. The transistor of claim 6, wherein the tunneling dielectric comprises aluminum oxide.

8. The transistor of claim 7, wherein the charge storage dielectric comprises silicon nitride.

9. The transistor of claim 2, wherein the charge storage dielectric comprises a metal oxide layer.

10. The transistor of claim 9, wherein the charge storage dielectric comprises tantalum oxide, zirconium oxide or hafnium oxide.

11. The transistor of claim 10, wherein the charge storage dielectric comprises tantalum oxide.

12. The transistor of claim 10, wherein the charge storage dielectric comprises zirconium oxide.

13. The transistor of claim 10, wherein the charge storage dielectric comprises hafnium oxide.

14. The transistor of claim 10, wherein the tunneling dielectric and the blocking dielectric comprise silicon oxide layers.

15. The transistor of claim 9, wherein the tunneling dielectric comprises a metal oxide layer.

16. The transistor of claim 10, wherein the tunneling dielectric comprises aluminum oxide, tantalum oxide, yttrium oxide, calcium oxide, magnesium oxide or zirconium oxide.

17. The transistor of claim 16, wherein the tunneling dielectric comprises aluminum oxide.

18. The transistor of claim 2, wherein the blocking dielectric comprises a metal oxide layer.

19. The transistor of claim 18, wherein the blocking dielectric comprises aluminum oxide, tantalum oxide, yttrium oxide, calcium oxide, magnesium oxide or zirconium oxide.

20. The transistor of claim 19, wherein the blocking dielectric comprises aluminum oxide.

21. The transistor of claim 2, wherein the tunneling dielectric comprises a metal oxide layer, the blocking dielectric comprises a metal oxide layer and the charge storage dielectric comprises a metal oxide layer.

22. The transistor of claim 21, wherein:
the tunneling dielectric comprises aluminum oxide, tantalum oxide, yttrium oxide, calcium oxide, magnesium oxide or zirconium oxide;
the charge storage dielectric comprises tantalum oxide, zirconium oxide or hafnium oxide; and
the blocking dielectric comprises aluminum oxide, tantalum oxide, yttrium oxide, calcium oxide, magnesium oxide or zirconium oxide.

23. The transistor of claim 22, wherein:
the tunneling dielectric comprises aluminum oxide;
the charge storage dielectric comprises tantalum oxide, zirconium oxide or hafnium oxide; and
the blocking dielectric comprises aluminum oxide.

24. The transistor of claim 2, wherein the insulating substrate comprises a silicon substrate covered by an insulating layer.

25. An inverted thin film transistor, comprising:
an insulating substrate;
a gate electrode located over the insulating substrate;
an active layer located over the gate electrode; and
a charge storage region located between the active layer and the gate electrode, wherein:
the charge storage region comprises a tunneling dielectric located adjacent to the active layer, a blocking dielectric located adjacent to the gate electrode and a charge storage dielectric located between the tunneling dielectric and the blocking dielectric; and
at least one of the tunneling dielectric, the charge storage dielectric and the blocking dielectric comprises a metal oxide layer having a dielectric constant greater than 3.9.

26. The transistor of claim 25, wherein the tunneling dielectric comprises a metal oxide layer and the charge storage dielectric comprises a metal oxide layer.

27. The transistor of claim 26 wherein:
the tunneling dielectric comprises aluminum oxide, tantalum oxide, yttrium oxide, calcium oxide, magnesium oxide or zirconium oxide; and
the charge storage dielectric comprises tantalum oxide, zirconium oxide or hafnium oxide.

28. The transistor of claim 27, wherein:
the tunneling dielectric comprises aluminum oxide;
the charge storage dielectric comprises tantalum oxide, zirconium oxide or hafnium oxide; and
the blocking dielectric comprises aluminum oxide.

29. A monolithic three dimensional array, comprising:
a substrate; and
a plurality of device levels comprising a plurality of thin film transistors with charge storage regions;
wherein at least one of a tunneling dielectric, a charge storage dielectric and a blocking dielectric in the charge storage regions comprises a metal oxide layer.

30. The array of claim 29, wherein the tunneling dielectric comprises a metal oxide layer and the charge storage dielectric comprises a metal oxide layer.

31. The array of claim 30, wherein:
the tunneling dielectric comprises aluminum oxide, tantalum oxide, yttrium oxide, calcium oxide, magnesium oxide or zirconium oxide; and
the charge storage dielectric comprises tantalum oxide, zirconium oxide or hafnium oxide.

32. The transistor of claim 31, wherein:
the tunneling dielectric comprises aluminum oxide;
the charge storage dielectric comprises tantalum oxide, zirconium oxide or hafnium oxide; and
the blocking dielectric comprises aluminum oxide.

33. The array of claim 29, wherein the array comprises:
a plurality of bottom gate thin film transistors in a first set of device levels;
a plurality of top gate thin film transistors in a second set of device levels; and
the device levels of the first set alternate with the device levels of the second set in the vertical direction with respect to the substrate.

34. A thin film transistor, comprising:
an insulating substrate;
an active layer located over the substrate;
a control gate electrode located over the substrate; and
a charge storage region located between the active layer and the control gate electrode, wherein the charge storage region comprises a metal oxide tunneling dielectric located adjacent to the active layer, a blocking dielectric located adjacent to the control gate electrode and a floating gate located between the tunneling dielectric and the blocking dielectric;

wherein the active layer is located above the control gate electrode; and wherein the blocking dielectric comprises aluminum oxide, tantalum oxide, yttrium oxide, calcium oxide, magnesium oxide or zirconium oxide.

35. The transistor of claim 34, wherein the tunneling dielectric comprises aluminum oxide, tantalum oxide, yttrium oxide, calcium oxide, magnesium oxide or zirconium oxide.

36. The transistor of claim 1, wherein the layer having a dielectric constant greater than 3.9 comprises a metal oxide layer.

37. The transistor of claim 36, wherein the tunneling dielectric comprises the metal oxide layer.

38. The transistor of claim 36, wherein the blocking dielectric comprises the metal oxide layer.

39. The transistor of claim 36, wherein the charge storage dielectric also comprises a metal oxide layer.

40. The transistor of claim 1, wherein the active layer is located above the gate electrode.

41. The transistor of claim 1, wherein the active layer is located below the gate electrode.

42. The transistor of claim 25, wherein the tunneling dielectric comprises the metal oxide layer.

43. The transistor of claim 25, wherein the charge storage dielectric comprises the metal oxide layer.

44. The transistor of claim 25, wherein the blocking dielectric comprises the metal oxide layer.

45. A thin film transistor, comprising:

an insulating substrate;

an active layer located over the substrate;

a control sate electrode located over the substrate; and a charge storage region located between the active layer and the control gate electrode, wherein the charge storage region comprises a tunneling dielectric located adjacent to the active layer, a metal oxide blocking dielectric located adjacent to the control gate electrode and a floating gate located between the tunneling dielectric and the blocking dielectric;

wherein the active layer is located above the control gate electrode; and wherein the tunneling dielectric comprises a metal oxide tunneling dielectric.

46. The array of claim 29, wherein each of the plurality of thin film transistors comprises the charge storage region which comprises the tunneling dielectric, the charge storage dielectric and the blocking dielectric.

* * * * *